United States Patent [19]
Yamashita

[11] Patent Number: 5,646,420
[45] Date of Patent: Jul. 8, 1997

[54] SINGLE ELECTRON TRANSISTOR USING PROTEIN

[75] Inventor: Ichiro Yamashita, Nara, Japan

[73] Assignee: Matsushita Electric Industrial Co., Ltd., Osaka, Japan

[21] Appl. No.: 596,756

[22] Filed: Feb. 5, 1996

[30] Foreign Application Priority Data

Feb. 3, 1995 [JP] Japan ................................. 7-016857

[51] Int. Cl.$^6$ ..................... H01L 29/06; H01L 31/328; H01L 31/336
[52] U.S. Cl. .................... 257/17; 257/20; 257/22; 257/23; 257/24; 257/25; 257/40
[58] Field of Search ................... 257/40, 17, 22, 257/20, 25, 24, 23

[56] References Cited

U.S. PATENT DOCUMENTS

| | | | |
|---|---|---|---|
| 5,252,719 | 10/1993 | Takeda et al. | 530/409 |
| 5,420,746 | 5/1995 | Smith | 361/311 |
| 5,475,341 | 12/1995 | Reed | 327/566 |

OTHER PUBLICATIONS

Y. Wada et al., "Quantum transport in polycrystalline silicon 'slit nano wire'", Appl. Phys. Lett. 65(5), Aug. 1, 1994, p. 624.

*Primary Examiner*—William Mintel
*Attorney, Agent, or Firm*—Wenderoth, Lind & Ponack

[57] ABSTRACT

The single electron transistor can be operated at room temperature. The distance between the electrodes 5, 5 can be adjusted by the length of the protein and/or the wideness of the lipid bilayer and the distance between the quantum dot 4 and one of the electrodes 5 can be adjusted in units of 1.5 Å by means of α-helix confirmation of a G segment of the protein.

19 Claims, 3 Drawing Sheets

SINGLE ELECTRON TRANSISTOR USING PROTEIN

BACKGROUND OF THE INVENTION

1. Field of the Invention

The present invention relates to a single electron transistor wherein single electron tunneling (hereinafter referred to as SET) phenomena can be generated at room temperature.

2. Description of Related Art

The single electron transistor has been considered as a substitute for MOSFET, which is the leading device of a Solid State transistor, because the demand for super miniaturization in a size of less than a submicron can be realized by application of SET to molecule devices.

Hitherto, the single electron transistor has been made containing a quantum dot means composed of polycrystalline silicon having a size of 5–8 nm in width, 10–20 nm in height and about 100 nm in length as reported in Appl. Phys. Left. 65(5), 1 August 1994, p.624. Theoretically, a possible application of SET to molecule devices is proposed by Yasuo Wade in "Principle of Single Electron Tunneling Phenomena and Possible Application to Molecule Device" published in the TECHNICAL REPORT OF IEICE, OME 93-59. The single electron transistor was fabricated as shown in FIG. 3 by firstly connecting three polyacetylene conductors A1, A2 and A3 through a pair of polyethylene insulators E1, E2 used as a tunnel junction, and secondly connecting the middle conductor A3 through a third polyethylene insulator E3 to a fourth polyacetylene conductor A4. It was reported that the opposite end conductors A1 and A2, respectively, act as an electrode, the middle conductor acts as the quantum dot means and the fourth conductor acts as a control gate.

However, where the quantum dot means is a semiconductor made of polycrystalline silicon doped with phosphorus P, the nearest transition level to the Fermi level is less than a level ($\Delta E$=about 25 mV) of electron thermal excitation at room temperature. Accordingly, in order to generate the SET phenomena in such devices, the devices must be cooled to about 4K, resulting in an impractical operating condition.

On the other hand, where the quantum dot is composed of polyacetylene, the SET phenomena at room temperature can be theoretically generated but there is no disclosure of how to set the transistor assembly and how to make each means to be fixed.

SUMMARY OF THE INVENTION

Therefore, it is an object of the present invention to provide a single electron transistor which can be operable at room temperature and can be actually fabricated.

According to an aspect of the present invention, there is provided a single electron transistor operable at room temperature, which comprises a pair of electrodes used as a source and a drain, a supporting protein material positioned between the pair of electrodes, a quantum dot means supported by the protein material, and a control gate connected to the quantum dot means, said quantum dot means being combined to at least one amino acid selected from an amino acid sequence of the supporting protein material in order to be supported at a selected distance from the electrodes with a space suitable for tunnel phenomena generation.

The protein material is a supporting means for connecting the pair of electrodes and the quantum dot means. For this object, $\alpha$-helix conformations of a bacteriorhodopsin, especially G,C $\alpha$-helix conformations may be preferably used. The protein having a desired length and a desired sequence can be synthesized by a Multiple Peptide Synthesizer AMS 422 made by MS technosystems Co. Ltd. Osaka in Japan.

The quantum dot means may be an electron conductive organic compound and preferably can be selected from the group consisting of organic compound molecules such as 7-acetyl-10-methyl-isoalloxazine traditionally called a Flavin. While the quantum dot means of the Flavin should be connected to at least one amino acid unit selected from an amino acid sequence of the supporting protein material, a Cysteine is preferred because the acetyl group of Flavin is easily combined with the S atom of Cysteine. Further, the quantum dot means may be made of liquid crystal resins containing a biphenyl construction such as 4-cyano-4'-n-pentylbiphenyl.

The electrode may be constructed directly from a pair of outer electrodes formed on a supporting substrate. It is recommended that the electrode constructed by or through an intermediate electrodes to be connected to the outer electrode. The intermediate electrode may be an inner complex salt containing a metal ion or ions such as porphyrins, preferably $M^+$terrakis-tetraphenyl-porphyrin ($M^+$is a metal ion such as $Mn^{3+}$, $Fe^{2+}$, $Mg^{2+}$, $Zn^{2+}$), since the porphyrin containing the metal ion inside becomes a hydrophilic electric conductor and is easily fixed on the end of the protein by combining the phenyl group to the end amino acid of the protein.

The control gate may be an organic polymer having a $\pi$ electron such as polyacetylene, because the organic polymer is a thin and soft film so as to be able to be inserted by itself between the hydrophobic groups of a lipid bilayer.

Therefore, according to a second aspect of the present invention, there is provided with a single electron transistor operable at room temperature, which comprises a lipid bilayer, each layer of which has hydrophobic groups oriented inside and opposed to each other, a protein material arranged in the lipid bilayer and having a segment or segments in a form of an $\alpha$-helix conformation such as G, C $\alpha$-helices of a bacteriorhodopsin, a quantum dot means combined to at least one amino acid unit of at least one segment of the protein material in order to be supported at a selected distance from the electrodes with a space suitable for tunnel phenomenon generation, a pair of electrodes used as a source and a drain and a control gate lying between the opposed hydrophobic groups and connected to the quantum dot means.

According to the present invention, the protein in a form of an $\alpha$-helix conformation is an insulating material while the electrode of the inner complex salt combined to the end of the protein is a conductive material, because the metal ion contained therein and the organic compound molecule is combined to an amino acid unit of peptide chain of the protein, so that, if 1) the electrodes of the inner complex salt are positioned on both ends of the protein a construction such as a conductor/one molecule/conductor can be provided so as to make a single electron transfer through the one molecule. In place of the electrodes such as 1) or contact with the electrodes such as 1), 2) conductors may be positioned on both ends of the lipid bilayer. In such a construction, 1) the distance between the electrodes of the inner complex salt can be adjusted by the length of the protein which can be synthesized, while 2) the distance between the conductors can be adjusted by the thickness of the lipid bilayer which can be changed by selecting the material.

On the other hand, the protein has 5.4 Å of average turn space and 3.6 amino acid units in one turn in the α-helix stereo conformation, so that the distance in a direction of the helix axis becomes 1.5 Å. That is, if the G segment of the protein has the following amino acid sequence: —Glu— Thr—Leu—Leu—Phe—Met—Val—Leu—Asp—Val— Ser—Ala—Cys—Val—Gly—Phe—Gly—Leu—Ile— Leu—, the distance in the helix axis direction is 1.5 Å. Therefore, by selecting the combined position of the organic compound molecule (the quantum dot means) to the amino acid of the protein, which position may be out of or at the center of the protein between the electrodes or conductors, the distance between the inner complex salts (the upper and lower intermediate electrodes) such as porphyrin and the organic compound molecule (the quantum dot means) such as the Flavin can be adjusted in units of 1.5 Å so that the distance can be fixed to such a distance (3 to 5 Å) in which the tunneling phenomena or effects can be generated by the Flavin which can act as the quantum dot. Further, the quantum dot means is made of one molecule such as Flavin, so that the nearest transition level to the Fermi level can be higher than the electron thermal excitation level, resulting in a generation of the tunneling phenomena.

In the case where the quantum dot can be formed, applying voltage to the control gate can make a variation of potential energy of the organic compound molecule. If the inner complex salt is set as the anode and a specific positive voltage is applied to the control gate, there is generated in the inner complex salt a transition level used for electric conduction. Further, increasing the voltage applied to the control gate makes a second transition level to be utilized, resulting in formation of step-like current-voltage characteristics.

The assembly of the protein insulant, one organic compound molecule quantum dot means and the inner complex salt electrodes is totally supported by a LB layer, so that positioning conductors on both sides of the LB layer enables the electrodes to be connected to an outer circuit.

DETAILED DESCRIPTION OF THE INVENTION

Figure 1:
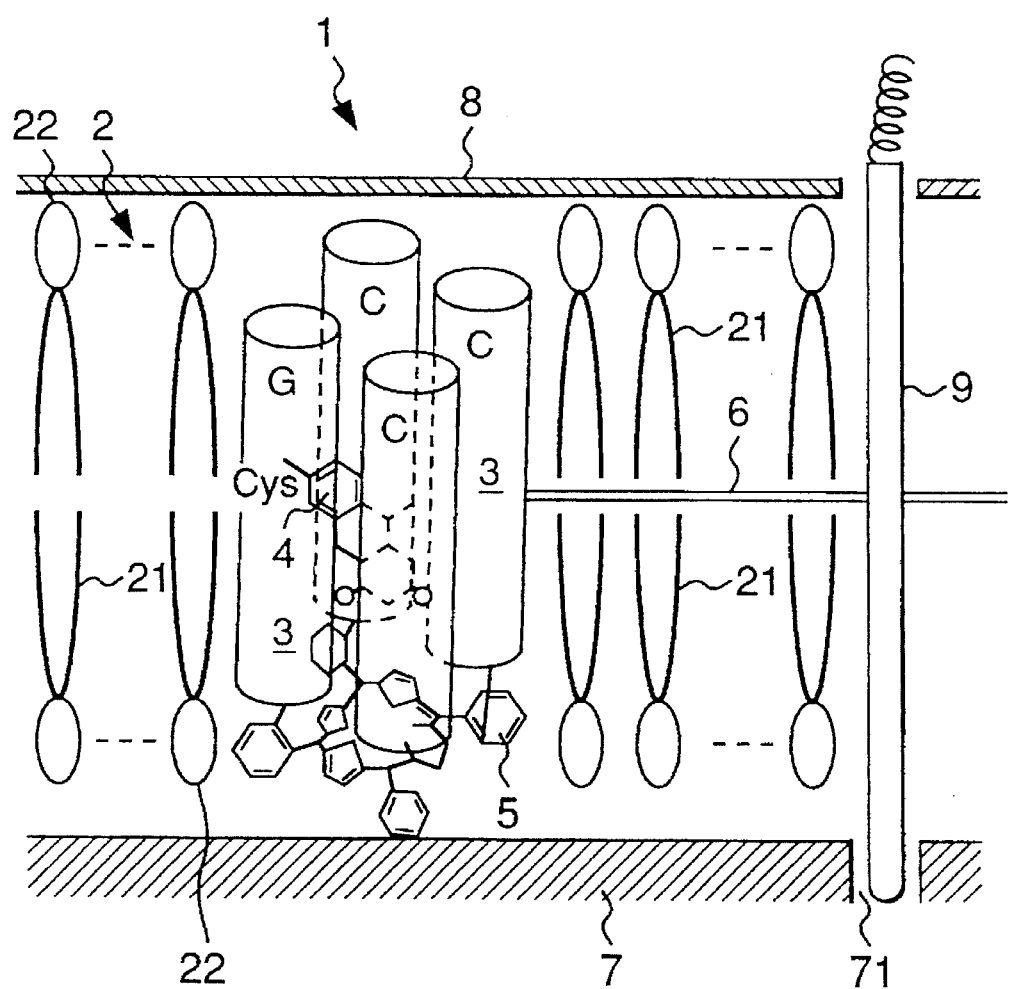
FIG. 1 is a schematic view showing a single electron transistor construction according to the present invention.

FIG. 1 shows the basic construction of the single electron transistor according to the present invention. The single electron transistor 1, comprises a lipid bilayer 2 (hereinafter referred to as a LB layer), each layer of which has hydrophobic groups 21 oriented inside and hydrophilic groups 22 oriented outside; a protein material 3 arranged between each layer of the LB layer and having a α-helix conformation and comprising four GCCC segments of the bacteriorhodopsin; a quantum dot means 4 made of 7-acetyl-10-methyl-isoalloxazine wherein the acetyl group is combined to an S atom of a cysteine of a G segment of the protein material; a pair of electrodes 5 made of $Mn^{3+}$ terrakis-tetraphenyl-porphyrin in which each ortho position of four phenyl groups is respectively combined to a corresponding alanine amino group (the end amino acid) of each segment; and a control gate 6 lying between the opposed hydrophobic groups and made of polyacetylene. There is indicated in the drawing only one of the electrodes 5 combined to the lower end of the protein 3, but to the upper end of the protein the same electrode is combined.

The following chemical formulas (I) and (II) respectively show the porphyrin combined to the alanine and the Flavin combined to the cysteine, wherein the dotted line is a combined portion of the alanine or cysteine.

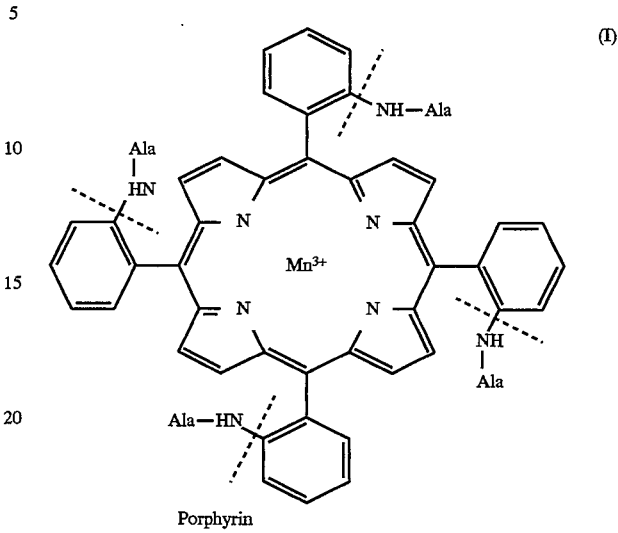

Porphyrin

The LB layer 2 is supported at one outer side by a substrate 7 made of carbon and at the other outer side an electric conductive layer 8 is formed. The conductive substrate 7 is provided with a through hole 71 which is used for inserting the outer terminal and must be isolated from the substrate 7.

The single electron transistor 1 can be prepared by the following steps.

Figure 2A:
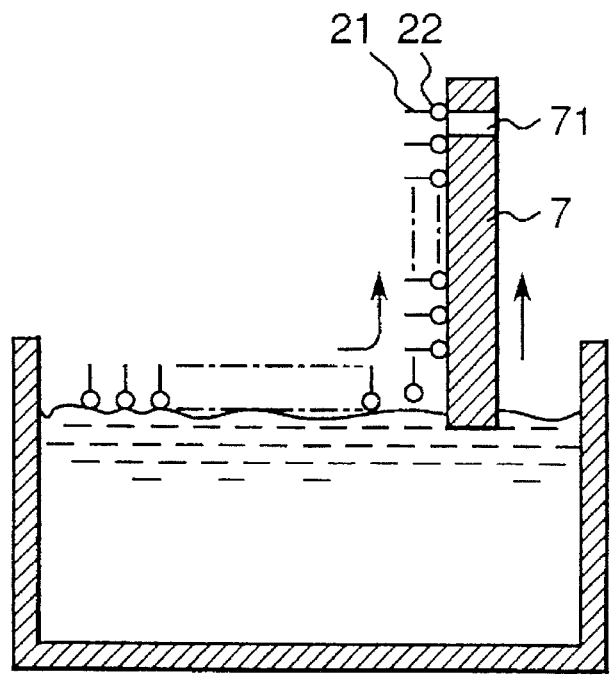
FIGS. 2A and 2B are schematic views respectively showing steps of preparing the LB layer.
Figure 2B:
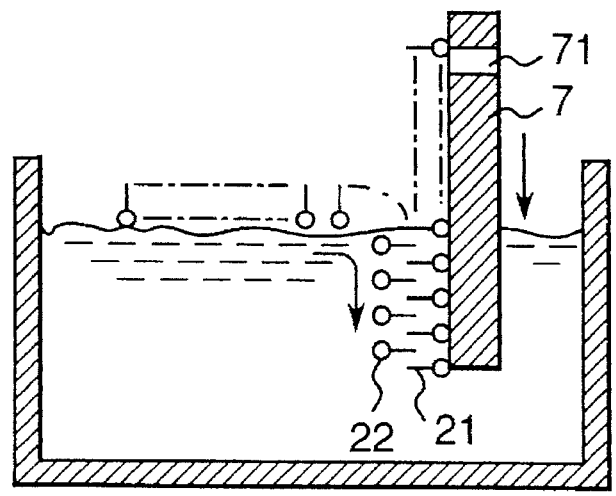
Figure 3:
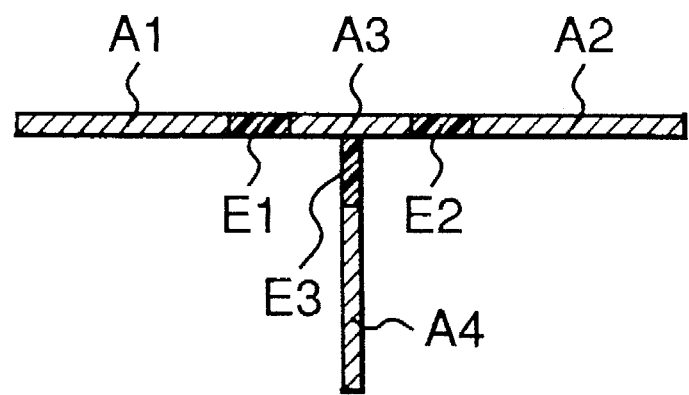
FIG. 3 is a schematic view showing a prior art construction of a single electron transistor.

Firstly, a lipid having hydrophilic groups 22 at one end is dropped and floated on the water. Into the water, the substrate 7 provided with the through hole 71 is inserted and is withdrawn from the water as shown in FIG. 2A. As the hydrophilic groups 22 of the lipid are adhered to the surface of the substrate 7, they follow the withdrawing substrate, and thus a lipid layer is formed on the surface of the substrate 7. Then, the substrate 7 provided with the lipid layer is inserted again into the water. The hydrophobic groups of the remaining lipid are adhered to the hydrophobic groups 21 of the lipid on the substrate 7 and follow the withdrawing substrate 7 to form a LB layer having a pair of the hydrophilic group opposed together as shown in FIG. 2B. The width of the LB layer 2 is about 5 nm, which should be controlled depending on the length of the protein by selecting the material.

On the other hand, there is prepared a powder of the protein which comprises GCCC segments having an α-helix confirmation in which Flavin is combined to a cysteine of a G segment in which the length of a G segment and the position of the cysteine can be adjusted by means of a Multiple Peptide Synthesizer. The porphyrin is combined to each end Ala-amino acid. In the protein, Flavin is combined to the G segment at a distance between the Flavin and one of the porphyrins of about 3 to 5 Å. Polyacetylene is also prepared for the control gate.

Secondly, the synthesized protein and the polyacetylene are floated on an alcohol such as ethanol and sprayed toward the LB layer 2 by means of ultrasonic vibration. They are inserted by themselves inside the LB layer 2 because of their hydrophobic characteristics.

After that, a part corresponding to the through hole 71 is masked and the substrate 7 is subjected to carbon vapor deposition to form the electric conductive layer on the LB layer 2.

The thus obtained single electron transistor 1 has the protein 3 at which both ends a pair of the electrodes 5, 5 made of porphyrin are positioned to have a contact with the conductive substrate 7 and the electric conductive layer 8, which have a contact with an outer circuit to make the voltage applied between the electrodes. On the other hand, as one Flavin molecule is combined to the cysteine of the G segment of the protein 3, the conductor/one molecule/conductor can be obtained, in which the Flavin molecule acts as the quantum dot means 4 and the single electron transfer can be made through the one molecule due to the tunneling effect.

Furthermore, since the quantum dot means 4 comprises one molecule of Flavin, the nearest transition level to the Fermi level becomes higher than the thermal excitation level (25 mV) of electron at room temperature. Accordingly, the tunneling phenomena can be confirmed at room temperature.

In such a case, when the outer terminal 9 is inserted into the through hole 71 and under a state of the outer terminal 9 contacted with the control gate 6, applying voltage to the control gate can make a variation of potential energy of one molecule of the Flavin. If one of the porphyrin electrodes is set as the anode and a specific positive voltage is applied to the control gate 6, there is generated in the inner complex salt a transition level used for electric conduction. Further, increasing the voltage applied to the control gate makes a second transition level to be utilized, resulting in formation of step-like current-voltage characteristics.

Accordingly, as a switching function, on-off control of the current between the electrodes 5, 5 can be achieved depending on the potential of the gate 6 by means of the single electron transistor 1. Since the single electron transistor 1 can be fabricated on the order of a nanometer, super miniaturization can be realized in the electronic field.

The single electron transistor can be used as a switching element loaded in the mini-electro device without cooling.

What is claimed is:

1. A single electron transistor operable at room temperature, which comprises first and second electrodes used as a source and a drain, respectively, a supporting protein material positioned between the first and second electrodes, a quantum dot means supported by the protein material, and a control gate connected to the quantum dot means, said quantum dot means being combined to at least one amino acid of the supporting protein material and being positioned between the first and second electrodes to generate tunnel phenomena.

2. The single electron transistor according to claim 1, wherein the protein material has G, C α-helix conformations of a bacteriorhodopsin which comprises a total of four segments: one is a G segment and the other three are C segments.

3. The single electron transistor according to claim 1, wherein the quantum dot means is a conductive organic compound or a liquid crystal resin.

4. The single electron transistor according to claim 1, wherein the conductive organic compound is 7-acetyl-10-methyl-isoalloxazine.

5. The single electron transistor according to claim 1, wherein the amino acid to be combined with the quantum dot means is Cysteine.

6. The single electron transistor according to claim 1, wherein each of the first and second electrodes are an inner complex salt containing a metal ion or metal ions which are respectively combined with an end amino acid of the protein material.

7. The single electron transistor according to claim 6, wherein the inner complex salt is a porphyrin.

8. The single electron transistor according to claim 7, wherein the porphyrin is $M^+$ terrakis-tetraphenyl-porphyrin and wherein.

9. The single electron transistor according to claim 1, wherein the control gate is an organic polymer having a π electron.

10. The single electron transistor according to claim 9, wherein the organic polymer is polyacetylene.

11. A single electron transistor operable at room temperature, which comprises a lipid bilayer, each layer of which has hydrophobic groups oriented inside and opposed to each other, a protein material arranged in the lipid bilayer and having a segment or segments in a form of an α-helix conformation, a quantum dot means combined to at least one amino acid of the protein material in the lipid bilayer, first and second electrodes used as a source and a drain, and a control gate lying between the opposed hydrophobic groups and connected to the quantum dot means, wherein the quantum means is positioned between the first and second electrodes to generate tunnel phenomena.

12. The single electron transistor according to claim 11, wherein the protein material has G, C α-helix conformations of a bacteriorhodopsin which comprises a total of four segments: one is a G segment and the other three are C segments.

13. The single electron transistor according to claim 11, wherein the quantum dot means is a conductive organic compound or a liquid crystal resin.

14. The single electron transistor according to claim 11, wherein the amino acid to be combined with the quantum dot means is Cysteine.

15. The single electron transistor according to claim 11, wherein each of the first and second electrodes are an inner complex salt containing a metal ion or metal ions, and each of the first and second electrodes are respectively combined to opposed end amino acids of the protein material.

16. The single electron transistor according to claim 1, wherein the control gate is an organic polymer having a π electron.

17. A single electron transistor operable at room temperature, which comprises:

a lipid bilayer, each layer of which has hydrophobic groups oriented inside and opposed to each other;

a protein material arranged in the lipid bilayer and having G, C α-helix conformations of a bacteriorhodopsin which comprises a total of four segments; one is a G segment and the other three are C segments;

a quantum dot means made of 7-acetyl-10-methyl-isoalloxazine which is combined to a Cysteine of a G segment of the protein material in the lipid bilayer;

first and second electrodes made of an inner complex salt containing a metal ion or ions used as a source and a drain; and a control gate lying between the opposed hydrophobic groups and made of an organic polymer having π electron, wherein the quantum dot means is positioned between the first and second electrodes to generate tunnel phenomena.

18. The single electron transistor according to claim 17, wherein the inner complex salt containing a metal ion or metal ions used for the electrodes is $M^+$ terrakis-tetraphenylporphyrin and wherein $M^+$ is a metal ion.

19. The single electron transistor according to claim 17, wherein the organic polymer used for the control gate is polyacetylene.

* * * * *